United States Patent
Lee et al.

(10) Patent No.: US 7,576,675 B1
(45) Date of Patent: Aug. 18, 2009

(54) RETURN-TO-ZERO CURRENT-STEERING DAC WITH CLOCK-TO-OUTPUT ISOLATION

(75) Inventors: Da-Huei Lee, Tainan (TW); Tai-Haur Kuo, Tainan (TW)

(73) Assignees: Megawin Technology Co., Ltd., Hsinchu (TW); National Cheng Kung University, Tainan (TW)

( * ) Notice: Subject to any disclaimer, the term of this patent is extended or adjusted under 35 U.S.C. 154(b) by 0 days.

(21) Appl. No.: 12/076,882

(22) Filed: Mar. 25, 2008

(51) Int. Cl.
*H03M 1/66* (2006.01)

(52) U.S. Cl. .................................. 341/144; 341/150
(58) Field of Classification Search ................. 341/144, 341/150, 153; 326/88, 27, 95; 327/379, 327/387
See application file for complete search history.

(56) References Cited

U.S. PATENT DOCUMENTS 5,331,225 A * 7/1994 Matsui et al. ............... 326/110
6,545,619 B1 * 4/2003 Segura et al. ............... 341/136
6,977,602 B1 * 12/2005 Ostrem et al. ............... 341/145
2007/0069810 A1 * 3/2007 Yang et al. .................. 327/568

OTHER PUBLICATIONS

Alex R. Bugeja, A Self-Trimming 14-b 100-MS/s CMOS DAC, IEEE Journal of Solid-State Circuits, vol. 35, No. 2, Dec. 2000, pp. 1841-1852.
Jouko Vankka, A Digital Quadrature Modulator with On-Chip D/A Converter, IEEE Journal of Solid-State Circuits, vol. 38, No. 10, Oct. 2003, pp. 1635-1642.

* cited by examiner

*Primary Examiner*—Peguy JeanPierre
(74) *Attorney, Agent, or Firm*—Rosenberg, Klein & Lee

(57) ABSTRACT

A return-to-zero current-steering DAC is presented. The presented return-to-zero technique can isolate the analog output nodes of the DAC from the coupling of the control signals of the DAC without sacrificing speed. The topology uses a bank of return-to-zero circuits, which employs return-to-zero and isolation transistors to implement the presented return-to-zero technique.

14 Claims, 5 Drawing Sheets

RETURN-TO-ZERO CURRENT-STEERING DAC WITH CLOCK-TO-OUTPUT ISOLATION

1. FIELD OF THE INVENTION

This invention relates to a digital-to-analog converter (DAC), and particularly to a current-steering DAC, which has return-to-zero characteristics at its output and can decrease the coupling from control signals to its output.

2. BACKGROUND OF THE RELATED ART

FIG. 1 shows a basic current-steering DAC where a plurality of current sources 101 is connected to analog output nodes 102, 103 via a plurality of switch pairs 104. The switch pairs 104 are controlled by the respective control signals 105 which are generated by the control signal generation circuits 106. The control signal generation circuits 106 receive a clock signal 107 and a digital input word 108 which represents a desired analog output of the DAC. For actual DACs, the control signals 105 will be coupled to the analog output nodes 102, 103 through the switch pairs 104.

One approach to reduce the coupling noise is to return the analog output nodes to "zero" by directly shorting the analog nodes to "zero". For the DAC without using return-to-zero (RTZ) techniques, the output signal power of the DAC falls off at a rate given by sin(x)/x as shown in FIG. 2. For the DAC using return-to-zero techniques, the output signal power of the DAC falls off at a rate given by sin(nx)/nx as shown in FIG. 3. However, this approach has disadvantages. The coupling noise of control signal switching to the output nodes are only attenuated not isolated, such that the effective impedance of the RTZ transistor strongly determines the attenuation of the coupling noise. To achieve large attenuation, the size of the RTZ transistor should be large. In addition, the RTZ control signals will be coupled to the output nodes via the parasitic capacitances.

Another approach to reduce the coupling noise is the use of isolation transistors. However, the settling time of the analog output nodes is increased, due to the use of isolation transistors, which is innegligible at high operation speed. The slow discharging action of the internal nodes between the switches and the isolation transistors causes different rise and fall times and large settling times. To solve this problem, the invention provides the internal nodes extra discharging paths and also returns the analog output nodes to "zero".

SUMMARY OF THE INVENTION

It is an object of this invention to provide a return-to-zero (RTZ) current-steering DAC with isolation transistors. The DAC can decrease the coupling noise of control signal switching and extend the input frequency range to the frequency close half the sampling frequency.

An embodiment according to the present invention includes an analog output which provides the DAC's analog output voltage and a digital input which receives a digital word representative of a desired analog output voltage. For operations, the outputs of the current sources are controlled by the respective control signals through respective switches. The states of the respective control signals change according to the digital input word and in synchronization with a clock signal. The present invention also includes a bank of RTZ circuits, which uses return-to-zero and isolation transistors to implement the presented return-to-zero technique. Therefore, the RTZ and isolation properties are both achieved by the present invention.

DETAILED DESCRIPTION OF THE INVENTION

Figure 1:
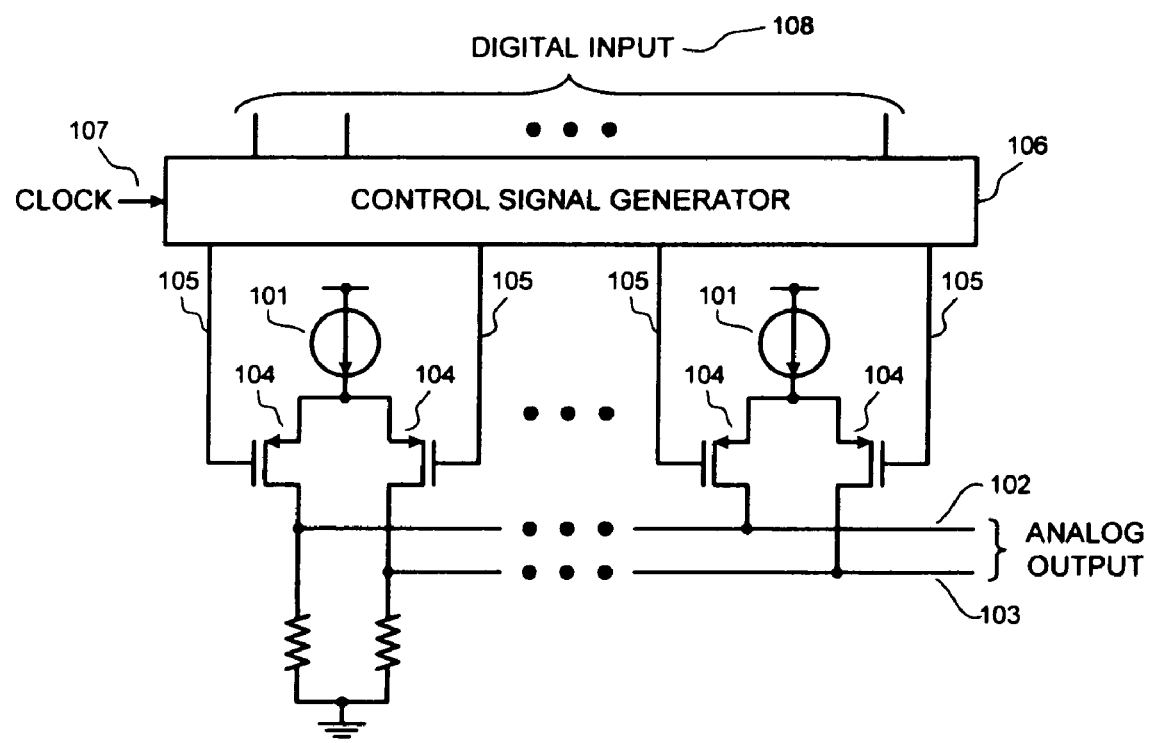
FIG. 1 is a block diagram of a basic current-steering DAC according to a prior art.
Figure 2:
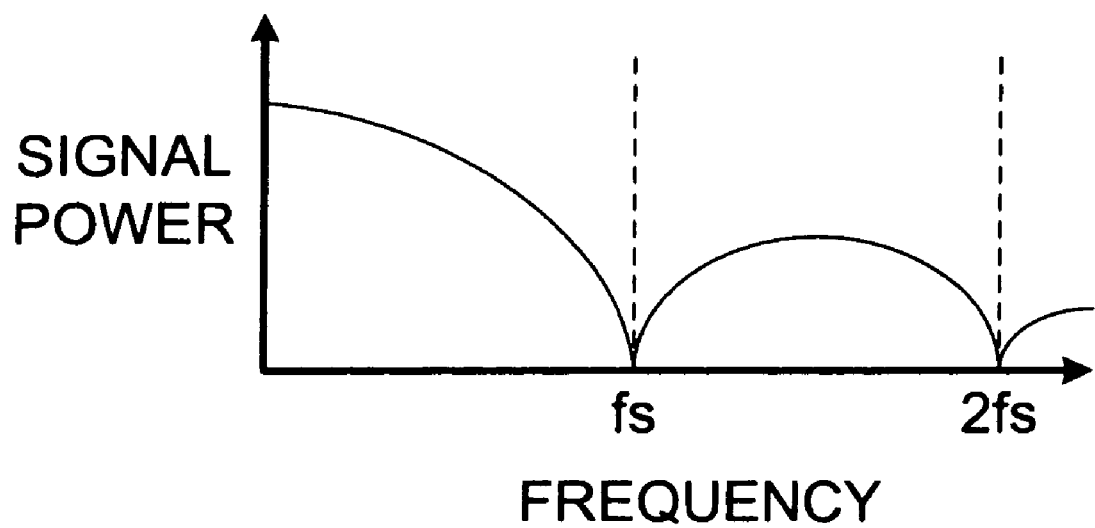
FIG. 2 is an output spectrum diagram of a DAC without RTZ according to a prior art.
Figure 3:
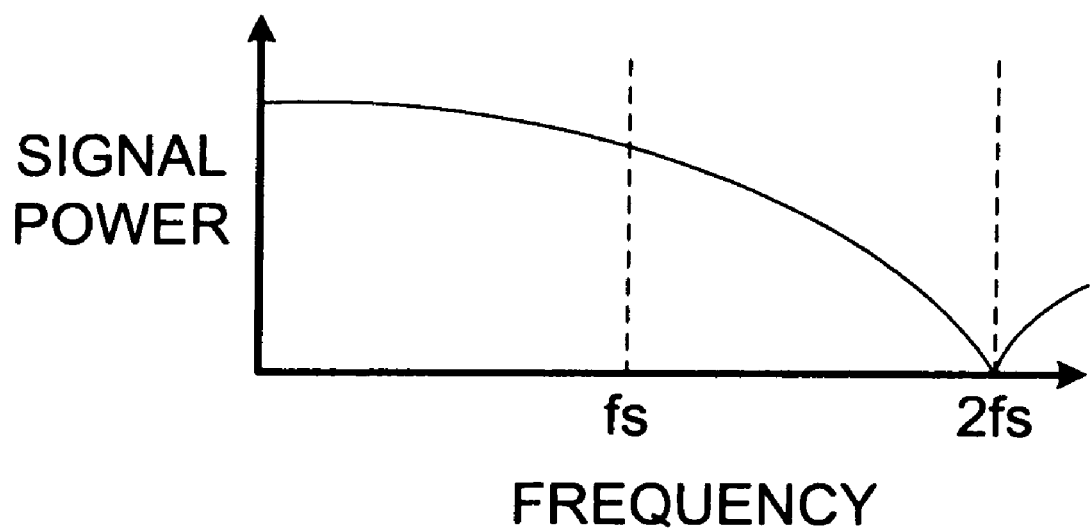
FIG. 3 is an output spectrum diagram of a DAC with RTZ according to a prior art.
Figure 4:
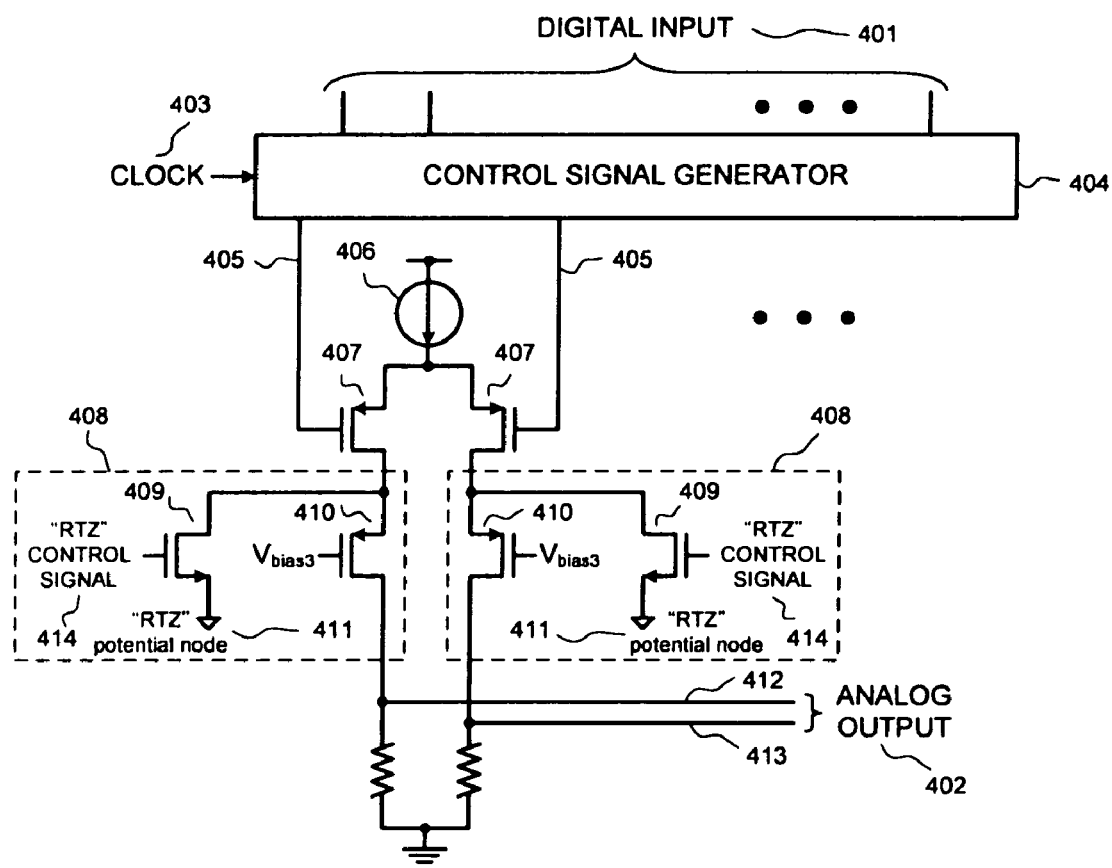
FIG. 4 is a block diagram of a current-steering DAC in accordance with the present invention.

An RTZ (return-to-zero) current-steering DAC with isolation transistors according to the present invention is shown in FIG. 4. The DAC receives a digital input word 401 and produces an analog output 402. The digital input word 401 is received by a differential control signal generator 404 clocked by a clock signal 403 for generating control signals 405. The DAC includes a plurality of current sources 406. The outputs of the current sources 406 are controlled by the respective control signals 405 through respective switches 407. A bank of RTZ circuits 408 is connected to the respective switches 407. In the RTZ circuits 408, return-to-zero transistors 409 and isolation transistors 410 are employed. An "RTZ" potential 411, which can be zero or non-zero potential, is defined for the RTZ circuits 408. The DAC produces a differential analog output on first and second output nodes 412, 413.

The switches 407, return-to-zero transistors 409 and isolation transistors 410 can be implemented by the field-effect transistors or bipolar transistors, which are made from silicon in general, and, of course, can be made from another material, e.g., gallium-arsenide (GaAs).

For detailed operations, the descriptions are as followings. The DAC receives a digital input word 401 by a differential control signal generator 404. The differential control signal generator 404 generates control signals 405 in synchronization with a clock signal 403. The control signals 405 control the respective switches 407 to direct the current from the outputs of the current sources 406 through the RTZ circuits 408 to the first or second output nodes 412, 413. The RTZ circuits 408 are connected to the respective switches 407. In the RTZ circuits 408, the isolation transistors 410 isolate the analog output nodes 412, 413 from the coupling of the control signals 405 through the respective switches 407, and the RTZ transistors 409 are controlled by a RTZ control signal 414 to direct the current from the respective switches 407 to an "RTZ" potential 411, which can be zero or non-zero potential, or not. The current from the isolation transistors 410 produces a differential analog output on the first and second output nodes 412, 413. The RTZ control signal 414 can be generated by a RTZ control circuit 408, which tracks the clock signal 403 to turns on/off the RTZ transistors 409.

Figure 5:
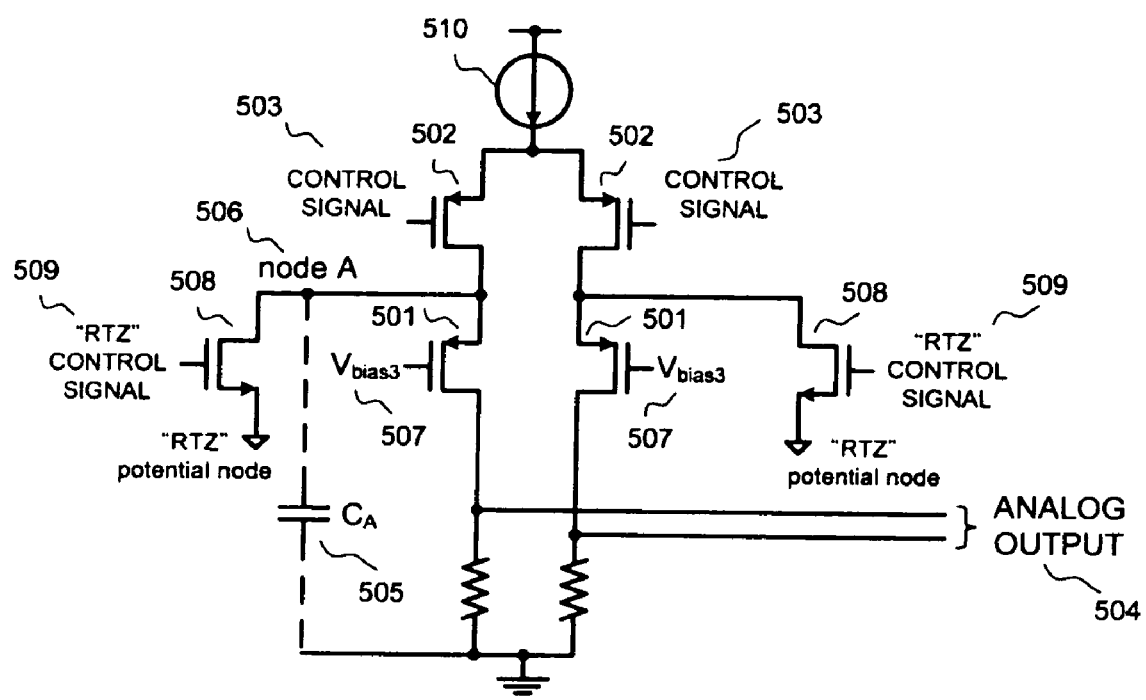
FIG. 5 is micro-view schematic of a current-steering DAC in accordance with the present invention.

The operation of the RTZ current-steering DAC according to the embodiment of the present invention is analyzed by accompanying with FIG. 5. Isolation transistors 501, as shown in FIG. 5, cascoded to the drains of the switches 502 for the DACs, can decrease the coupling of the control signals 503 to the analog output nodes 504. Unfortunately, these isolation transistors 501 increase the output settling time and cause different rise and fall times. When the gate state of the switch 502 is changed from low to high, the current through the switch 502 is switched off. However, due to the stored charge in the parasitic capacitor $C_A$ 505, there is a discharging current flowing to the output node 504 through the isolation transistor 501. The current through the isolation transistor 501 can be expressed as $$I_{M_{12}}(t) = K[(V_A(t) - V_{bias3}) - V_t]^2$$

where $K=(\mu C_{ox}/2)(W/L)$ is the device transconductance parameter, $V_A$ is the voltage of node A 506, $V_{bias3}$ 507 is the gate voltage of the isolation transistor 501, and $V_t$ is the threshold voltage of the isolation transistor 501. This current discharges the capacitor $C_A$ 505 and thus decreases the voltage $V_A$. The discharging current can also be written as $$I_{M_{12}}(t) = -\frac{dQ_A(t)}{dt}$$

where $Q_A$ is the charge stored in node A 506. Equating the two equations, the time domain equation of $V_A$ can be derived as $$V_A(t) = C_1 - \frac{ab(t+C_2) - 1}{b(t+C_2)}$$

where $C_1$ and $C_2$ are constants determined by initial conditions, $a=V_{bias3}+V$, and $b=(K/C_A)$. Therefore, the settling time of the analog output nodes 504 is increased due to the discharging behavior of node A 506.

In order to solve this problem, an extra discharging path is added to node A 506. When the RTZ transistor 508 is switched on, the charge stored in $C_A$ 505 is discharged rapidly because of the designed high driving capability of the RTZ transistor 508. In addition to discharging node A 506, the RTZ transistor 508, can also be used to return the analog output nodes 504 to be "zero". When the RTZ control signal 509 turns on the RTZ transistors 508, the current from the current source 510 will flow through the RTZ transistors 508 according to the condition of the switches 503. Therefore, no current will flow through the isolation transistors 501, i.e., the isolation transistors 501 are turned off, and the output nodes 504 will settle to zero with a time constant. Because the isolation transistors 501 are turned off, the signal dependent coupling of the control signals 503 will be isolated during the RTZ period. Therefore, the present invention can achieve the properties of RTZ and isolation. Instead of using high-linearity RTZ transistors at the DAC output nodes, each current cell of the DAC contains its own RTZ transistors.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. A current-steering digital-to-analog converter, comprising:
    a differential control signal generator to receive digital inputs and a clock signal for producing control signals, wherein said control signals depend on said digital inputs and said clock signal;
    a plurality of current sources for producing output currents;
    a plurality of switches connected to said plurality of current sources and controlled by said control signals;
    a plurality of isolation transistors connected between said plurality of switches and an analog output, wherein said plurality of isolation transistors are controlled by biased potentials to decouple said switches and said analog output; and
    a plurality of return-to-zero transistors connected between a return-to-zero potential node and connection nodes of said plurality of switches to said plurality of isolation transistors, wherein said plurality of return-to-zero transistors are controlled by return-to-zero control signals.

2. The current-steering digital-to-analog converter in claim 1, wherein said return-to-zero potential node has a ground voltage.

3. The current-steering digital-to-analog converter in claim 1, wherein said return-to-zero potential node has a fixed voltage which is not the ground voltage.

4. The current-steering digital-to-analog converter in claim 1, wherein said plurality of switches, said plurality of isolation transistors and said plurality of return-to-zero transistors are field-effect transistors.

5. The current-steering digital-to-analog converter in claim 1, wherein said plurality of switches, said plurality of isolation transistors and said plurality of return-to-zero transistors are bipolar transistors.

6. The current-steering digital-to-analog converter in claim 4 or 5, wherein said field-effect transistors and/or said bipolar transistors are made from gallium-arsenide.

7. The current-steering digital-to-analog converter in claim 1, further comprising a return-to-zero control circuit, which generates said return-to-zero control signals.

8. A current-steering digital-to-analog converter, comprising:
    a differential control signal generator to receive digital inputs and a clock signal for producing differential control signals, wherein said differential control signals depend on said digital inputs and said clock signal;
    current sources which produce output currents;
    one of first switches and one of second switches, which are connected to one of said current sources and controlled by said differential control signals;
    one of first isolation transistors, which is connected between a first analog output and one of said first switches, and one of second isolation transistors, which is connected between a second analog output and one of said second switches, wherein said first isolation transistors and said second isolation transistors are controlled by biased potentials to decouple the connections of said first switches and said first analog output and the connections of said second switches and said second analog output, respectively; and
    each of first return-to-zero transistors connected between a return-to-zero potential node and each of connection nodes of said first switches and said first isolation transistors, and each of second return-to-zero transistors connected between said return-to-zero potential node and each of connection nodes of said second switches and said second isolation transistors, wherein said first return-to-zero transistors and said second return-to-zero transistors are controlled by return-to-zero control signals.

9. The current-steering digital-to-analog converter in claim 8, wherein said return-to-zero potential node has a ground voltage.

10. The current-steering digital-to-analog converter in claim 8, wherein said, return-to-zero potential node has a fixed voltage which is not the ground voltage.

11. The current-steering digital-to-analog converter in claim 8, wherein said first switches, said second switches, said first isolation transistors, said second isolation transistors, said first return-to-zero transistors and said second return-to-zero transistors are field-effect transistors.

12. The current-steering digital-to-analog converter in claim 8, wherein said first switches, said second switches, said first isolation transistors, said second isolation transistors, said first return-to-zero transistors and said second return-to-zero transistors are bipolar transistors.

13. The current-steering digital-to-analog converter in claim 11 or 12, wherein said field-effect transistors and/or said bipolar transistors are made from gallium-arsenide.

14. The current-steering digital-to-analog converter in claim 8, further comprising a return-to-zero control circuit, which generates said return-to-zero control signals.

* * * * *